United States Patent [19]
Northey

[11] Patent Number: 5,613,864
[45] Date of Patent: Mar. 25, 1997

[54] VACUUM PICK-UP DEVICE FOR HEADER CONNECTOR

[75] Inventor: William A. Northey, Etters, Pa.

[73] Assignee: Berg Technology, Inc., Reno, Nev.

[21] Appl. No.: 348,218

[22] Filed: Nov. 28, 1994

[51] Int. Cl.⁶ .................................................. H01R 13/44
[52] U.S. Cl. ........................................... 439/149; 439/940
[58] Field of Search .................................... 439/135, 148, 439/149, 940; 29/739, 837, 879

[56] References Cited

U.S. PATENT DOCUMENTS

| | | | |
|---|---|---|---|
| 4,197,945 | 4/1980 | Sherwood | 206/328 |
| 4,396,245 | 8/1983 | Lane | 339/38 |
| 4,598,962 | 7/1986 | Reitz et al. | 339/17 L |
| 4,795,354 | 1/1989 | Owen | 439/137 |
| 4,932,890 | 6/1990 | Cheng | 439/367 |
| 5,026,295 | 6/1991 | Fong et al. | 439/135 |
| 5,055,971 | 10/1991 | Fudala et al. | 361/400 |
| 5,096,428 | 3/1992 | Lwee et al. | 439/79 |
| 5,106,313 | 4/1992 | Lwee et al. | 439/135 |
| 5,242,311 | 9/1993 | Seong | 439/135 |
| 5,249,977 | 10/1993 | Tanaka et al. | 439/135 |
| 5,277,601 | 1/1994 | Miyazawa | 439/135 |

OTHER PUBLICATIONS

AT&T Technical Digest, R.F. Smith, No. 74, p. 31, Jul. 1984.
IBM Technical Disclosure Bulletin vol. 33 No. 1A Jun. 1990, pp. 351 and 352.

*Primary Examiner*—Neil Abrams
*Attorney, Agent, or Firm*—Daniel J. Long; M. Richard Page

[57] ABSTRACT

A cover (36) for use in transporting headers by vacuum suction comprising a dielectric housing (12), terminals (14) mounted on the housing and pins arranged in an array (18) comprising a plurality of rows (20 and 22), said cover comprising an upper section (38) including a smooth top surface (40), a plurality of generally parallel longitudinal ridges (42, 44 and 46) extending downwardly from the top section and a groove (54 and 56) interposed between adjacent ridges and said ridges and grooves being positioned so that one of said rows of pins is engageable in each of said grooves and a transverse member (62 and 64) extends across at least a part of at least one of the grooves. A method of using the cover is also disclosed.

15 Claims, 6 Drawing Sheets

5,613,864

1

VACUUM PICK-UP DEVICE FOR HEADER CONNECTOR

BACKGROUND OF THE INVENTION

1. Field of the Invention

The present invention relates to electrical connectors and more particularly to devices used in the assembly of electrical connectors.

2. Brief Description of the Prior Developments

Electronic components are often manipulated for positioning on electrical apparatus as, for example, on a printed wiring board by means of vacuum suction nozzles. A problem with the use of such vacuum suction nozzles, however, exists with regard to their use with headers since the upward extending pin array on such headers presents no surface on which the vacuum suction nozzle can engage the device.

To solve this problem it has been suggested, for example, in U.S. Pat. No. 5,242,311 that a cover having a flat upward facing surface be positioned over and engaged with the pin array to enable a vacuum nozzle to pick up the header. While such an arrangement would appear to provide efficiencies in the manipulation of headers by vacuum suction means, it has been observed that it may by difficult to always correctly center the header.

Further, it would appear that such arrangements may require covers which would be particularly adapted for use with particular pin arrays. Thus, it might be necessary for a manufacturer working with a number of different pin arrays to maintain supplies of a number of sizes of covers.

There is, therefore, a need for a vacuum pick-up header cover which can easily be centered on a header. There is also a need for such a cover which resists sliding off the header. There is a further need for such a cover which is adapted for use with a variety of pin arrays.

SUMMARY OF THE INVENTION

The present invention comprises a cover for use in transporting headers by vacuum suction means. This cover includes a top section with a flat upwardly facing surface adapted for engagement by a vacuum nozzle. Extending downwardly from this top section are a plurality of parallel longitudinally extending ridges. Between these ridges are grooves which are adapted in dimension to engage rows of pins in a pin array on the header. At strategically positioned points there are transversely extending webs across these grooves which abut pins in each of these rows and enable the cover to be centered on the array and which prevent the header from being longitudinally displaced with regard to the cover. The webs are also positioned in such a way so that the cover may ordinarily be adapted for use on more than one type of pin array. Also encompassed within this invention is a method for transporting a header in which the cover is superimposed over, engaged with the header, prevented from being laterally displaced and engaged with vacuum suction means. The connector of the present invention may be used with any type of card-line data processing medium which includes, without limitation, memory cards which term will be considered to include, without limitation any type 1, type 2 or type 3 PCMCIA card as well as any other card which may be used in any type of computer system to perform a similar function.

BRIEF DESCRIPTION OF THE DRAWINGS

The vacuum suction header cover of the present invention is further described with reference to the accompanying drawings in which.

DETAILED DESCRIPTION OF THE PREFERRED EMBODIMENTS

Figure 1A:
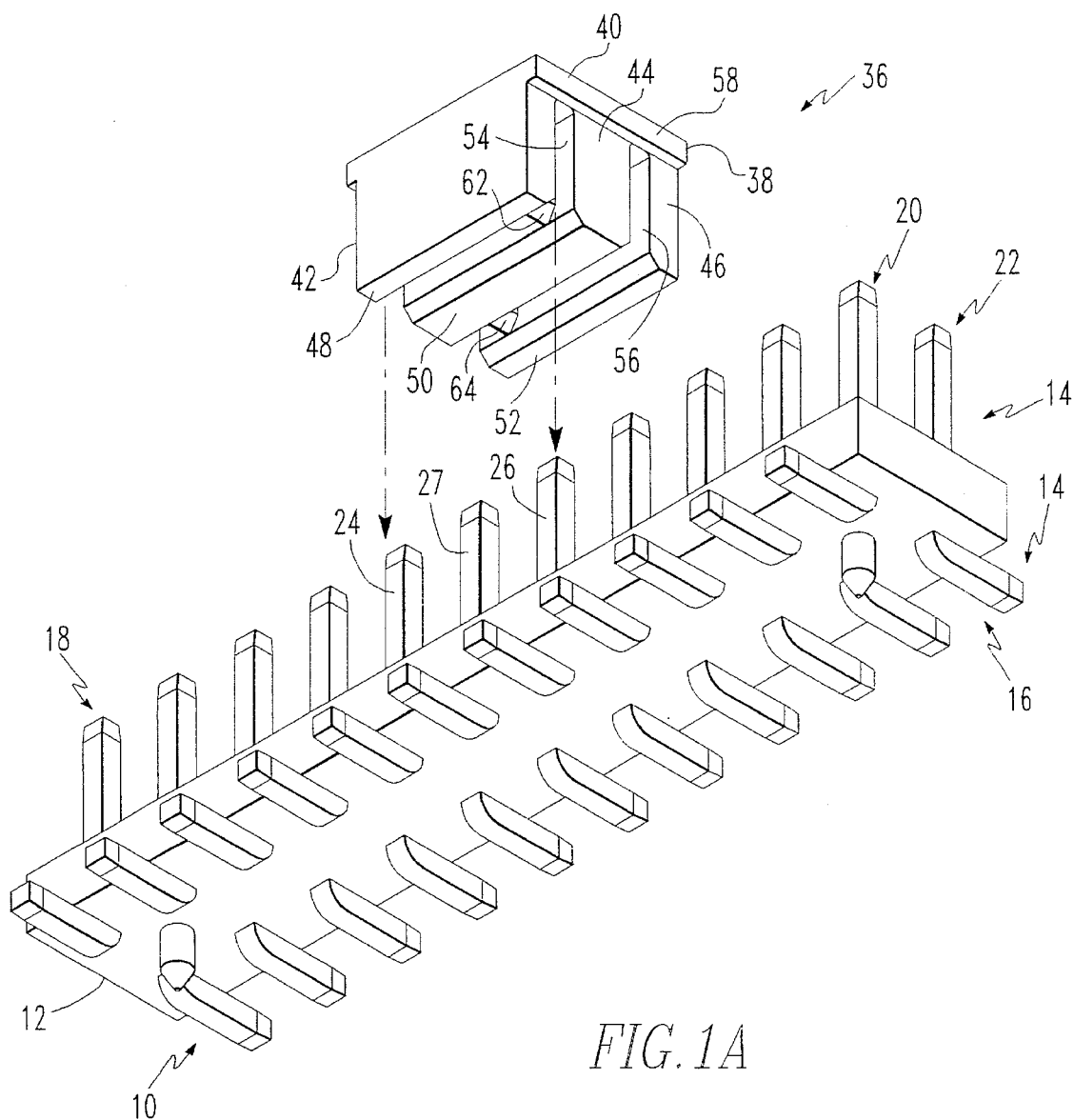
FIG. 1A is a perspective view of a preferred embodiment of the cover of the present invention and a header in a disengaged relation.
Figure 1B:
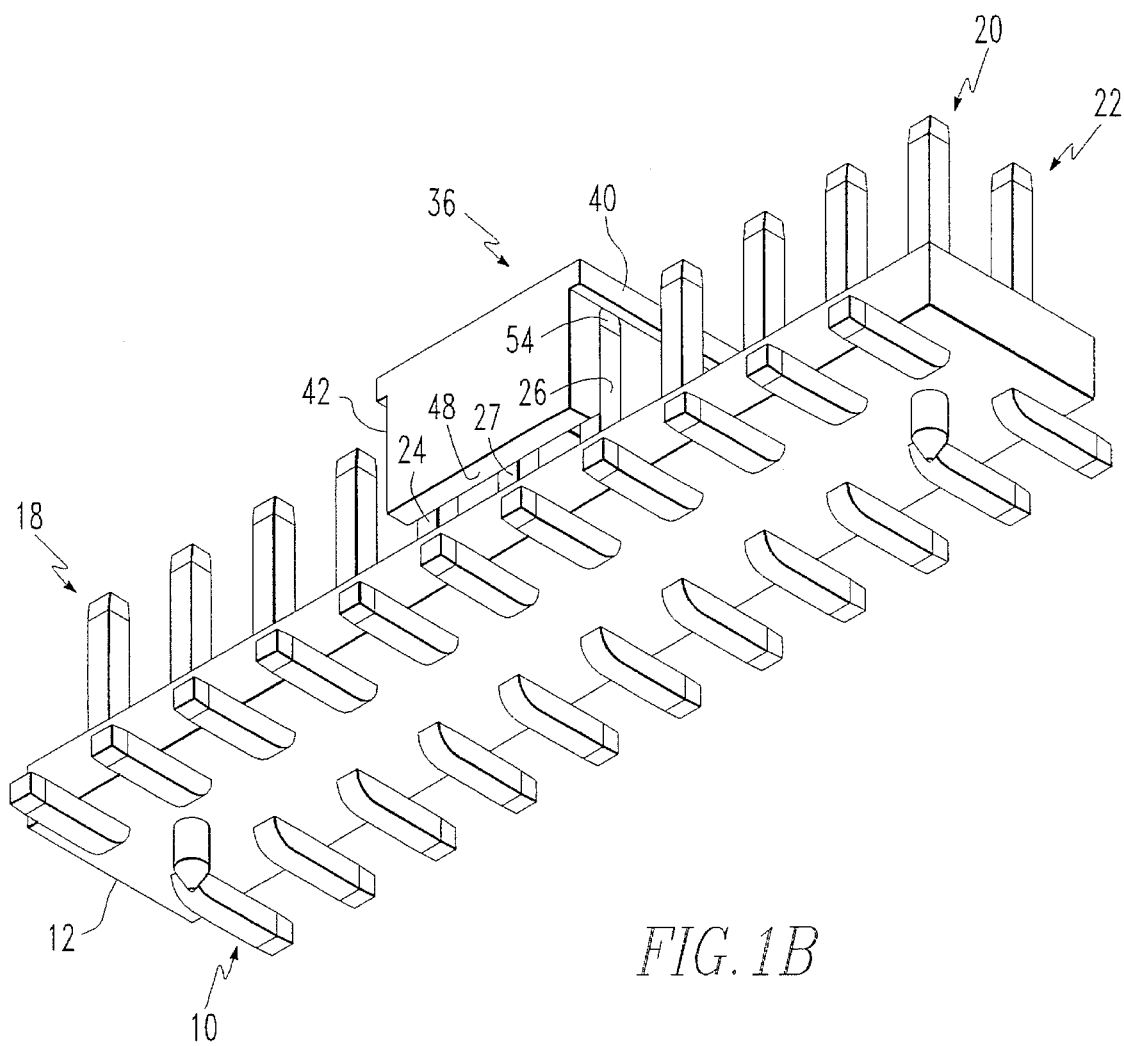
FIG. 1B is a perspective view of the cover and header shown in FIG. 1A in engaged relation.
Figure 2:
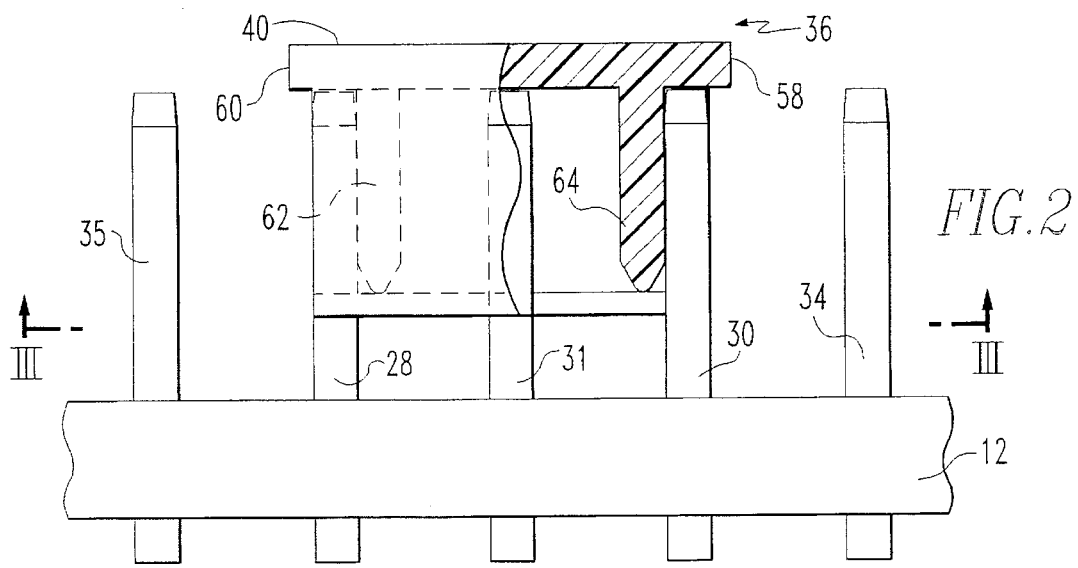
FIG. 2 is a side elevational view of a cover of the present invention engaged with the header.

Referring to FIGS. 1A through 4, a header is generally shown at numeral 10. This header includes dielectric housing 12, terminals shown generally at numeral 14 which terminals have a tail portion generally at 16 and a pin array generally at 18. This pin array includes rows 20 and 22 and in row 20 there are end pins at 24 and 26 and medial pin 27. In row 22 there are end pins 28 and 30 and medial pin 31. In each row there are plurality of pin positions as at 32 which is either a position which contains a pin or an empty position with room to accommodate a pin. In addition to the pins over which the cover is superimposed, it will be understood that there may be other pins as at 33, 34 and 35. It will also be seen that there is a dimension pin size T which is the width or diameter of a pin; pitch P which is the distance between corresponding positions in two alternately positioned pins in a row; row displacement R which is the distance between the center lines of two adjacent rows; W which is preferred maximum web thickness and G which is slot width. The cover is shown generally at numeral 36. It has an upper section 38 with a smooth top surface 40. Extending downwardly from the upper section are longitudinal ridges 42, 44 and 46 which terminate respectively in foot 48, foot 50 and foot 52. Between these ridges there are formed grooves 54 and 56. These grooves have a width G which will be approximately equal to pin thickness T so as to be able to receive and engage the pins. The covers have ends 58 and 60. Extending transversely across each of these grooves from one of the ends there are webs 62 and 64. Although these webs extend completely across the groove, it will be appreciated that it will also be possible to use transverse members which project into the groove but do not completely extend across it. In particular, it is believed that a pair of transverse members which extend toward each other across the groove but do not join would usefully be employed. It will be observed that because of the positioning of these webs, the webs 62 and 64 respectively abut the inner side of end pin 24 in row 20 and of end pin 30 in row 22. The two medial pins 27 and 31 will also be positioned under the cover.

Figure 3:
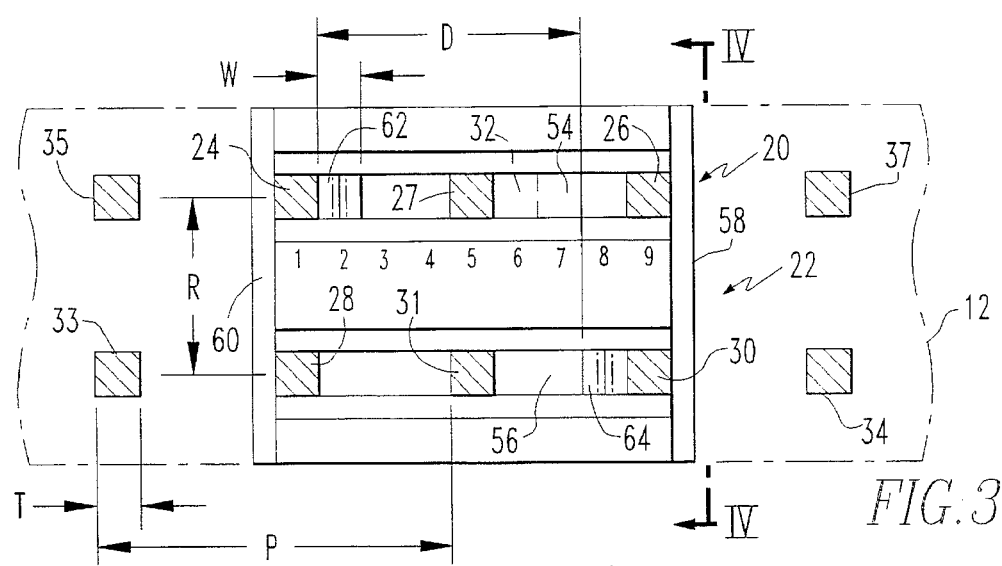
FIG. 3 is a horizontal cross sectional view of the cover and header assembly taken through line III—III in FIG. 2.
Figure 4:
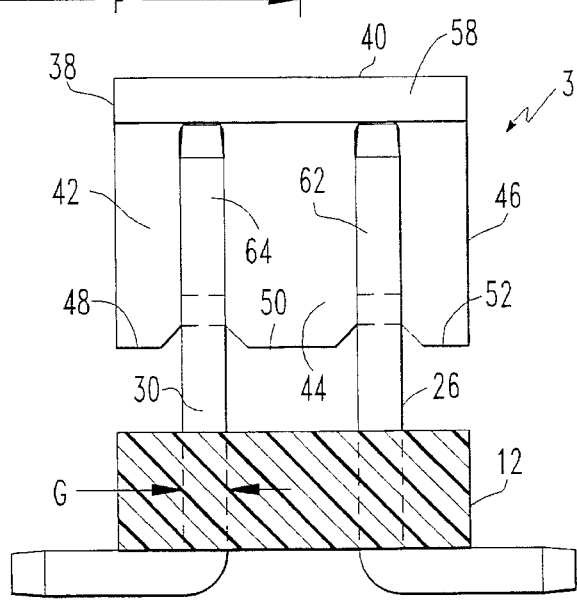
FIG. 4 is a end view of the cover and header assembly taken through line IV—IV in FIG. 3.
Figure 5:
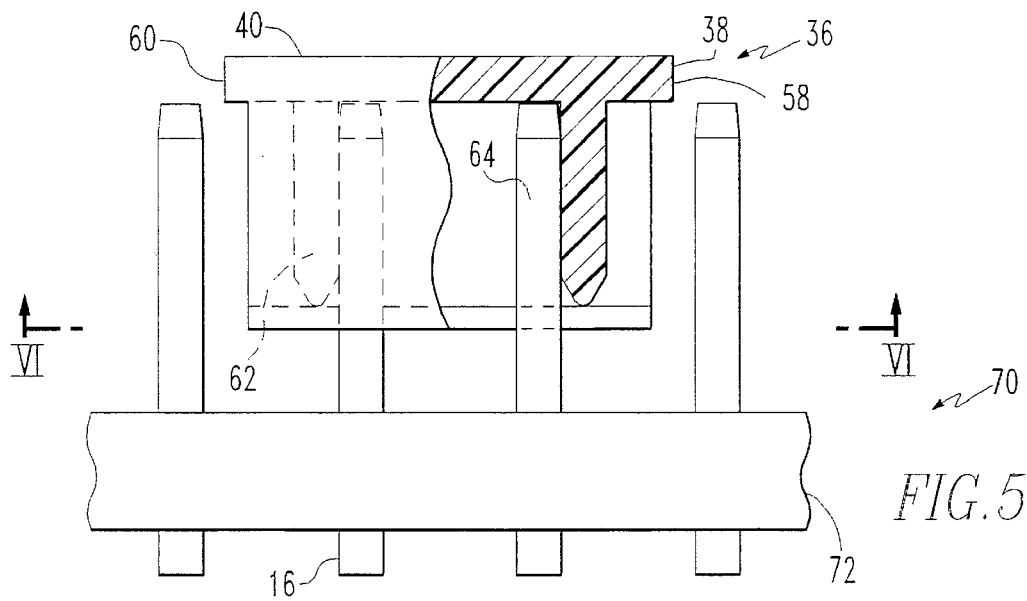
FIG. 5 is a cut away side elevational view of the cover shown in FIGS. 2–4 engaged with a header with a different pin array.
Figure 6:
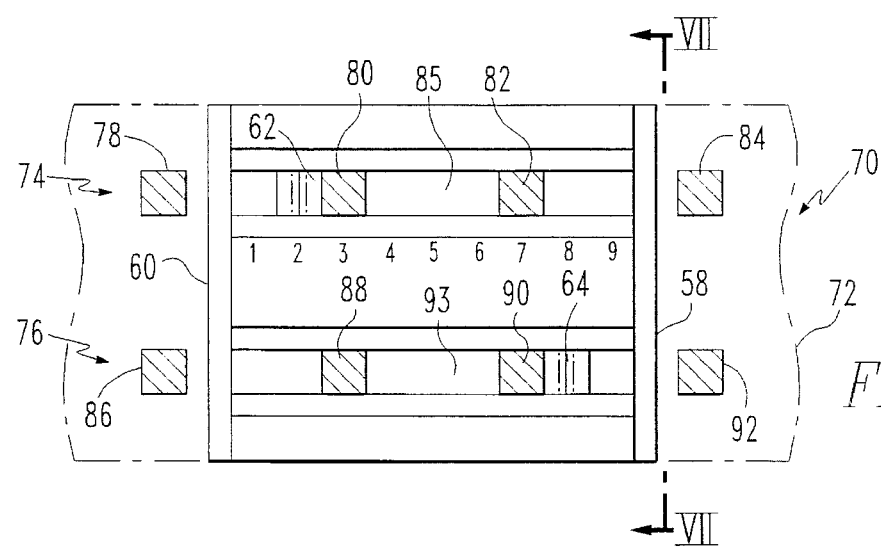
FIG. 6 is a horizontal cross sectional view of the cover and header assembly taken through line VI—VI in FIG. 5.

From FIGS. 2–7 it will be seen that certain preferred means of practicing the present invention may be used when a cover is to be employed in a centered position on a symmetrical header. That is, the grooves will hold an odd number of pin positions. For example, on the embodiments shown in both FIGS. 2–4 and FIGS. 5–7, there are nine pin positions illustrated by numerals 1–9 in both grooves 54 and 85. It will be understood that grooves 56 and 93 also have nine similarly positioned pin positions although they are not numbered. As is shown in FIG. 3, when there are an odd number of pins in a groove the webs may be advantageously positioned so that each of them abuts the inner sides of one of the end pins. For example, in FIG. 3 web 62 abuts the inner side of pin 24, and web 64 abuts the inner side of pin 30. As is shown in FIG. 6, when there are even number of pins in a groove the webs may be advantageously positioned so that each of them abuts the outer side of one of the end pins. For example, in FIG. 6 web 62 abuts the outer side of pin 80, and web 64 abuts the outer side of pin 90.

Figure 7:
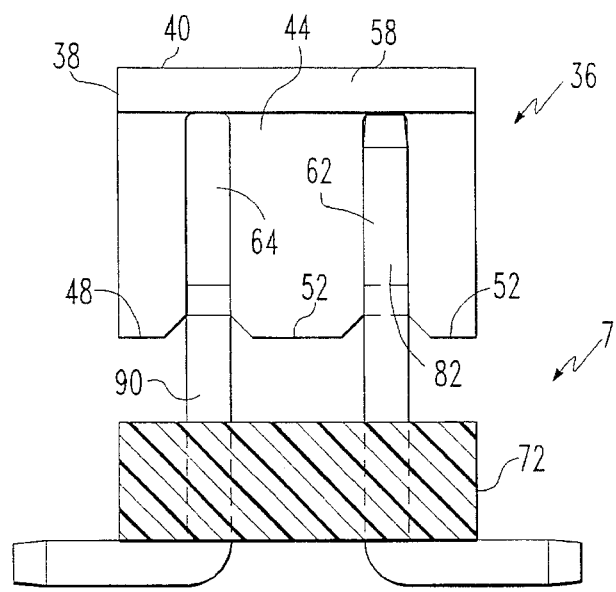
FIG. 7 is an end view of the cover and header assembly from line VII—VII in FIG. 6.

Referring to FIGS. 5 through 7, the cover is shown in use with another header shown generally at numeral 70. This header includes dielectric housing 72 and pin rows shown generally at numerals 74 and 76. Pin row 74 includes pins 78, 80, 82 and 84, and pins 80 and 82 are in grooves 85. Pin row 74 includes pins 86, 88, 90 and 92 and pins 88 and 90 are in groove 93. In this situation the cover is superimposed over pins 80, 82, 88 and 90. The two webs 62 and 64 abut respectively the outer edges of pins 80 and 90.

Figure 8:
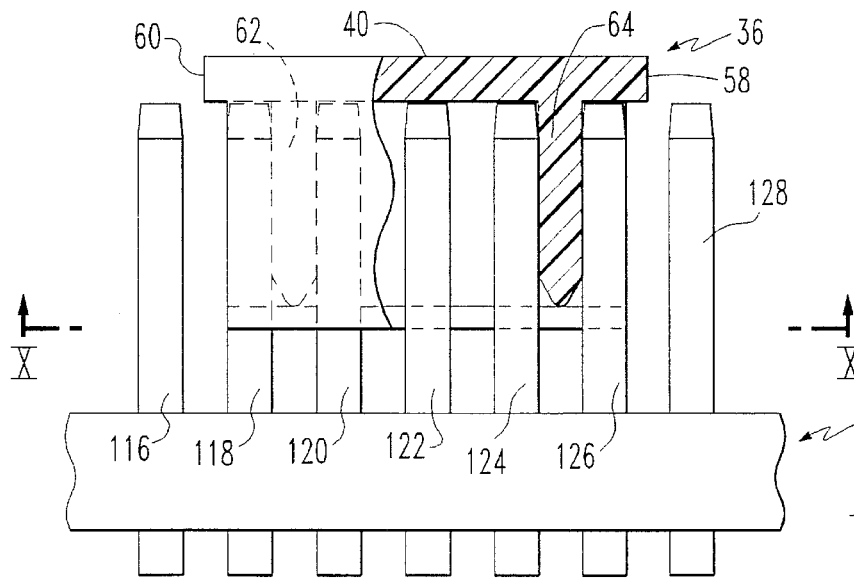
FIG. 8 is a cut away side elevational view of the cover shown in FIGS. 2–4 engaged with a header with a still different pin array.
Figure 10:
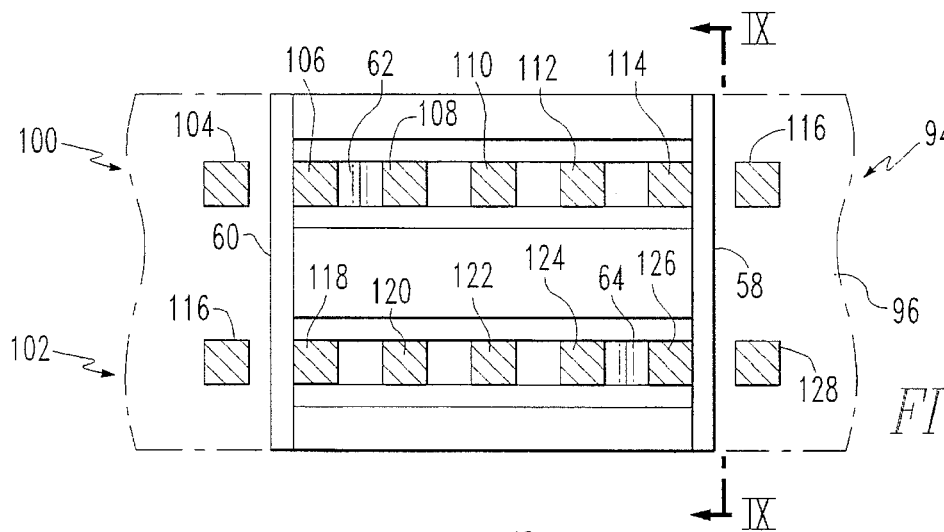
FIG. 10 is a horizontal cross sectional view of the cover and header assembly taken through line X—X in FIG. 8.
Figure 9:
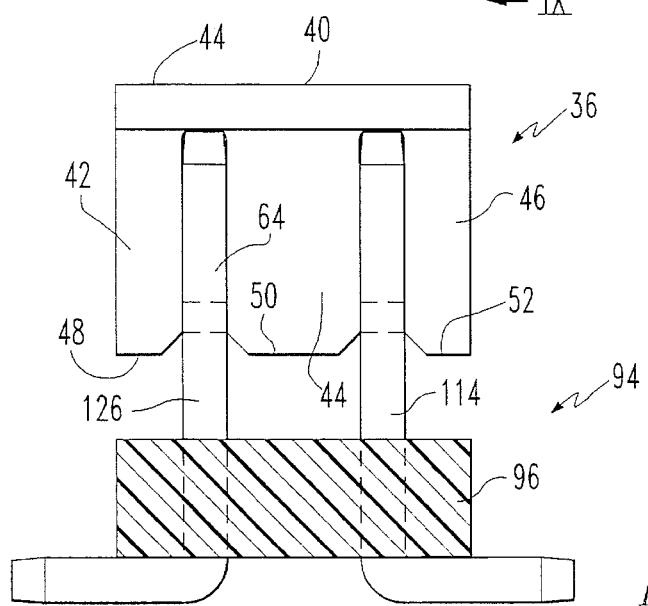
FIG. 9 is an end view of the cover and header assembly shown from line IX—IX in FIG. 10.

Referring to FIGS. 8 through 10, the cover is shown in use with another header having a different pin array and shown generally at numeral 94. This header includes dielectric housing 96 and pin rows shown generally at numerals 100 and 102. Pin row 100 is made up of relatively closely spaced pins 104, 106, 108, 110, 112, 114 and 116. Pin row 102 is made up of other relatively closely spaced pins 116, 118, 120, 122, 124, 126 and 128. In this situation the cover is superimposed over pins 106, 108, 110, 112, 118, 120, 122, 124 and 126. The web 62 abuts the inner edge of pin 104 and the outer edge of pin 106. Web 64 abuts the inner edge of pin 126 and the outer edge of pin 124. Thus, it will be appreciated that this common web position serves to secure the pin array shown in all of the different headers illustrated above.

It has been found that preferred values of maximum preferred web thickness and web spacing can be calculated from the following formulae. Where, as is explained above, P is pitch and T is pin size, maximum preferred web thickness W may be calculated from the following equation (1).

$$W = \tfrac{1}{2}P - T \quad (1)$$

Web spacing may then be calculated from the following equation (2) where n is any positive integer, but which ordinarily is from 1 to 6.

$$D = nP - T - W \quad (2)$$

It will be appreciated that by using different integers for n in equation (2) for different pin arrays, it will often be possible to determine a value of D for several different pin arrays that will be suitable for several different pin arrays. By selecting a value for W which would also be appropriate for several pin arrays, it will thus be possible to design covers which are suitable for use with a variety of headers.

Figure 11:
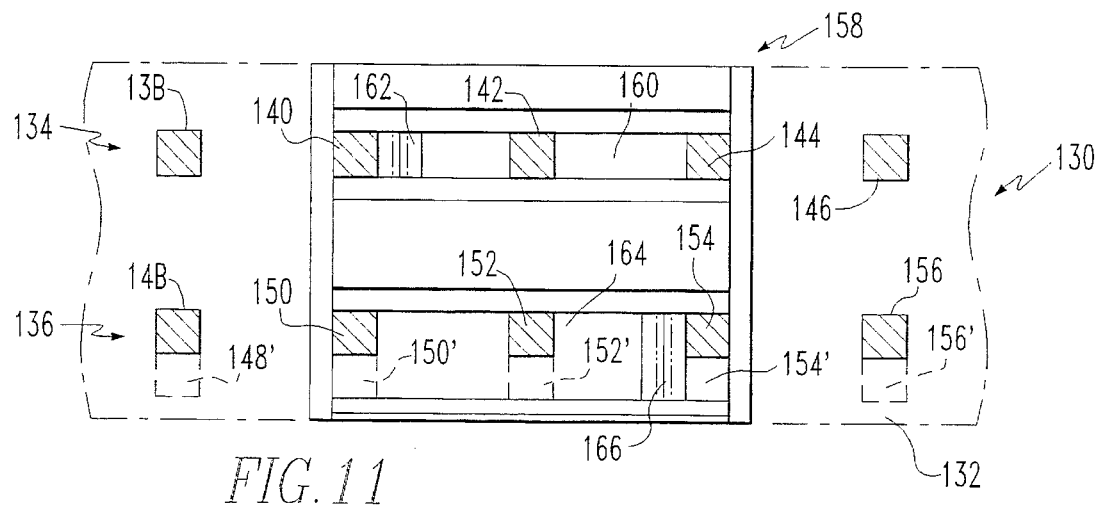
FIG. 11 is a cross sectional view similar to FIG. 3 showing a cover representing another preferred embodiment of the present invention engaged with a header.

Referring to FIG. 11, it will be seen that in this embodiment the cover is engaged with a header shown generally at numeral 130 which is made up of a dielectric housing 132 and which has pin rows 134 and 136. Pin row 134 is made up of pins 138, 140, 142, 144 and 146. Pin row 136 is made up of pins 148, 150, 152, 154 and 156. The cover shown generally at numeral 158 includes a groove 160 having a transverse web 162. This cover also includes a wide groove 164 which has a wide web 166. In this arrangement web 162 abuts the inner side of pin 140 and web 166 abuts the inner side of pin 154. It will be appreciated, however, that this arrangement would also accommodate a pin array having a different row spacing. For example, if row 138 included pins having positions at 148', 150', 152', 154' and 156', pin 154' would still be engaged by web 166 and pins 150' and 152' would still be positioned within wide groove 164.

Figure 12:
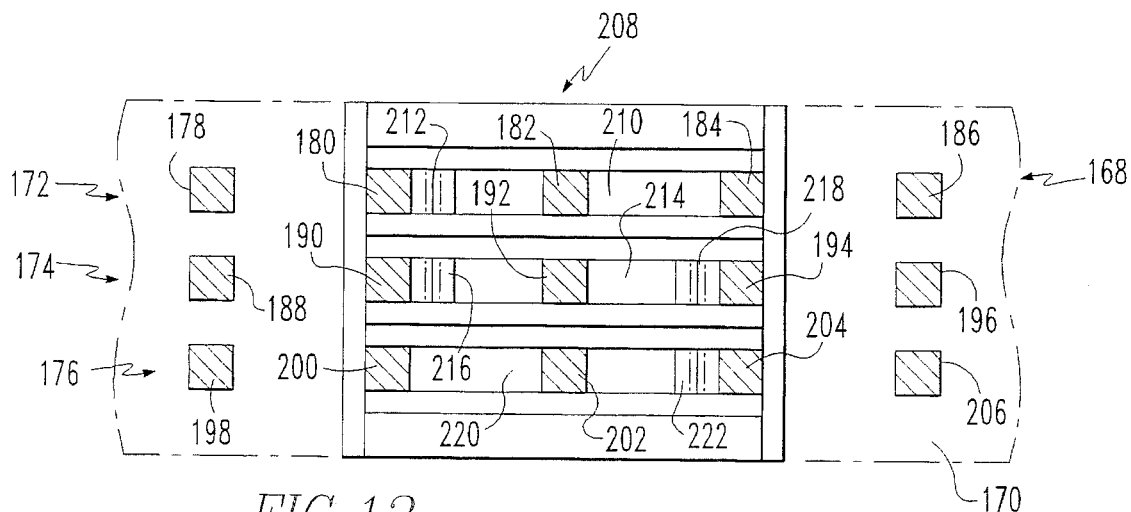
FIG. 12 is a cross sectional view similar to FIG. 3 showing a cover representing still another preferred embodiment of the present invention engaged with a header.
Figure 13:
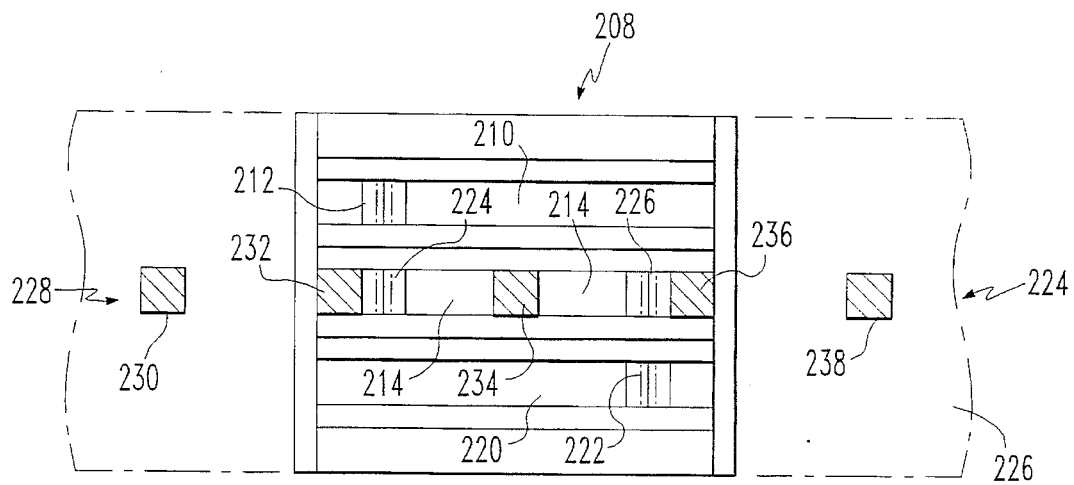
FIG. 13 is another cross sectional view similar to FIG. 3 of the cover shown in FIG. 12 showing that cover engaged with a different header.

Referring to FIGS. 12 and 13, still another way in which a single cover can accommodate multiple pin arrays is illustrated. Referring particularly to FIG. 12, there is a header shown generally at numeral 168. This header includes dielectric housing 170 and has three pin rows shown generally at 172, 174 and 176. Pin row 172 includes pins 178, 180, 182, 184 and 186. Pin row 174 includes pins 188, 190, 192, 194 and 196. Pin row 176 includes pins 198, 200, 202, 204 and 206. The cover shown at numeral 208 includes an edge groove 210 which has a transverse web 212. The cover also includes a medial groove 214 which has two transverse webs 216 and 218. There is another edge groove 220 which has a transverse web 222. In this arrangement pins 180, 182 and 184 are within groove 210 and the inside of pin 180 abuts web 212. Pins 190, 192 and 194 are within groove 214 and web 216 abuts the inside of pin 190 and web 218 abuts the inside of pin 194. Referring particularly to FIG. 13, it will be seen that the same cover 208 can be used to engage a one row pin array as well as the three row pin array shown in FIG. 12. In the arrangement shown in FIG. 13 there is a header shown generally at 224 which includes dielectric housing 226 and a single pin row shown generally at 228. This pin row includes pins 230, 232, 234, 236 and 238. The end grooves of the cover 210 and 220 and their webs respectively 212 and 222 engage no pins. The medial groove, however, retains the pins 232, 234 and 236 and the webs 224 and 226 abut against pins 232 and 236 respectively on the inner sides of those pins It will be appreciated that a vacuum pick-up header cover has been described which can be easily centered on a header, which resists sliding off the header and which is adapted for use with a variety of pin arrays.

While the present invention has been described in connection with the preferred embodiments of the various figures, it is to be understood that other similar embodiments may be used or modifications and additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A cover for use in transporting a first header by vacuum suction, which first header comprises a dielectric housing, terminals mounted on the housing and pins each having an inner and an outer side arranged in an array comprising at least one row, said cover comprising an upper section including a smooth top surface, a plurality of generally parallel longitudinal ridges extending downwardly from the top section and at least one groove interposed between adjacent ridges and said ridges and said at least one groove being positioned so that at least one of said rows of pins of the first header is engageable in one of the grooves and a first transverse member extends across at least a part of one of the grooves and abuts a first pin in said first header on its outer side to engage said first pin in said first header by frictional means and a second transverse member extends across at least a part of one of the grooves and abuts a second pin in said first header on its outer side to engage said second pin in said first header by frictional means and said cover also is engageable with a second header which second header comprises a dielectric housing, terminals mounted on said housing and pins each having an inner and outer side arranged in an array comprising at least one row different from the array of the first header such that one of said rows of pins of the second header is engageable in one of the grooves and the first transverse member abuts a first pin in said second header on its inner side to engage said first pin in said second header by frictional means and the second transverse member abuts a second pin in said second header on its inner side to engage said second pin in said second header by frictional means.

2. The cover of claim 1 wherein transverse members extend transversely across at least a part of each of the grooves.

3. The cover of claim 1 wherein a transverse member extends completely across at least one of the grooves.

4. The cover of claim 1 wherein the transverse member facilitates centering the cover over the header.

5. The cover of claim 1 wherein in the groove containing the transverse member there are a plurality of pin receiving positions and in each row there are a pair of opposed end pins occupying pin receiving positions further outward than any other pins in each of said rows.

6. The cover of claim 1 wherein there are an odd member of pin positions in the groove in which the transverse member is positioned.

7. The cover of claim 6 wherein in the row of pins engaging the groove in which the web member is positioned there are an odd number of pins and the end pins have inner and outer sides and one of said end pins abuts the web member on its inner side.

8. The cover of claim 6 wherein in the row of pins engaging the groove in which the transverse member is positioned there are an even number of pins and the end pins have inner and outer sides and one of said end pins abuts the transverse member on its outer side.

9. The cover of claim 2 wherein the transverse member has a maximum preferred web thickness W and pins in the header have a pin size T and a pitch P and maximum preferred web thickness W is calculated from the following equation (1)

$$W = \tfrac{1}{2}P - T \qquad (1).$$

10. The cover of claim 9 wherein webs are separated by a longitudinal web spacing D calculated from the following equation (2) wherein n is a positive integer $$D = nP - T - W \qquad (2).$$

11. The cover of claim 9 wherein n is from about 1 to about 6.

12. The cover of claim 2 wherein the pin array has a row spacing dimension R and at least one of the grooves is sufficiently wide to accommodate a pin array having a different row spacing dimension.

13. The cover of claim 2 wherein the pin array includes one or more rows of pins and the grooves are arranged to accommodate pin arrays having different numbers of rows.

14. A cover for use in transporting a first header by vacuum suction, which first header comprises a dielectric housing, terminals mounted on the housing and pins each having an inner and an outer side arranged in an array comprising a plurality of rows, said cover comprising an upper section including a smooth top surface, a plurality of generally parallel longitudinal ridges extending downwardly from the top section and a plurality of grooves interposed between adjacent ridges and said ridges and grooves being positioned so that said rows of pins of the first header are engageable in one of the grooves and a first transverse member extends across at least a part of another one of the grooves and abuts a first pin in said first header on its outer side to engage said first pin in said first header by frictional means and a second transverse member extends across at least a part of one of the grooves and abuts a second pin in said first header on its outer side to engage said second pin in said first header by frictional means and said cover also is engageable with a second header which second header comprises a dielectric housing, terminals mounted on said housing and pins each having an inner and outer side arranged in an array comprising at least one row different from the array of the first header such that one of said rows of pins of the second header is engageable in one of the grooves and the first transverse member abuts a first pin in said second header on its inner side to engage said first pin in said second header by frictional means and the second transverse member abuts a second pin in said second header on its inner side to engage said second pin in said second header by frictional means.

15. A cover for use in transporting a first header by vacuum suction, which first header comprises a dielectric housing, terminals mounted on the housing and pins each having an inner and an outer side arranged in an array comprising a single row, said cover comprising an upper section including a smooth top surface, a plurality of generally parallel longitudinal ridges extending downwardly from the top section and at least one groove interposed between adjacent ridges and said ridges and said at least one groove being positioned so that said row of pins of the first header is engageable in one of the grooves and a first transverse member extends across at least a part of one of the grooves and abuts a first pin in said first header on its outer side to engage said first pin in said first header by frictional means and a second transverse member extends across at least a part of one of the grooves and abuts a second pin in said first header on its outer side to engage said second pin in said first header by frictional means and said cover also is engageable with a second header which second header comprises a dielectric housing, terminals mounted on said housing and pins each having an inner and outer side arranged in an array comprising a single row different from the array of the first header such that said row of pins of the second header is engageable in one of the grooves and the first transverse member abuts a first pin in said second header on its inner side to engage said first pin in said second header by frictional means and the second transverse member abuts a second pin in said second header on its inner side to engage said second pin in said second header by frictional means.

* * * * *